United States Patent [19]

Kunces

[11] Patent Number: 4,699,811
[45] Date of Patent: Oct. 13, 1987

[54] CHROMIUM MASK FOR ELECTROLESS NICKEL OR COPPER PLATING

[75] Inventor: David J. Kunces, Naugatuck, Conn.

[73] Assignee: MacDermid, Incorporated, Waterbury, Conn.

[21] Appl. No.: 908,396

[22] Filed: Sep. 16, 1986

[51] Int. Cl.$^4$ .............................................. C23C 18/16
[52] U.S. Cl. ...................................... 427/259; 204/15; 204/51; 204/192.1; 156/664; 430/315; 427/437; 427/438; 427/443.1
[58] Field of Search ..................... 427/437, 438, 443.1, 427/259; 204/15, 51, 192 C; 430/315; 156/664

[56] References Cited

U.S. PATENT DOCUMENTS 4,254,163  3/1981  Piazza ................................. 427/259
4,600,480  7/1986  Coombes ............................. 204/51

OTHER PUBLICATIONS

Gawrilov, "Chemical (Electroless) Nickel Plating", pp. 136, 137, published 1979.

*Primary Examiner*—John D. Smith
*Attorney, Agent, or Firm*—St. Onge Steward Johnston & Reens

[57] ABSTRACT

Chromium is employed as the mask in selective electroless plating of nickel or copper on a substrate. The chromium is applied conveniently by electroplating in the case of conductive substrates or by sputtering in the case of non-conductive substrates.

14 Claims, No Drawings

CHROMIUM MASK FOR ELECTROLESS NICKEL OR COPPER PLATING

BACKGROUND OF THE INVENTION

1. Field of the Invention

This invention relates to a process for electroless plating of nickel or copper and is more particularly concerned with selective electroless plating of nickel or copper on a substrate.

2. Description of the Prior Art

In the electroless plating of nickel or copper on conductive or non-conductive surfaces it is often necessary to deposit the metal selectively only on certain predetermined areas. One of the reasons for applying nickel or copper in this manner is to take advantage of one or more of the unique properties of electroless nickel or copper such as their solderability, lubricity, chemical resistance and uniform buildup of plate. Another reason is a question of cost i.e., to avoid wasting nickel or copper on areas where they are not needed.

Various methods have been employed for masking of areas onto which deposition of nickel or copper is to be prohibited. One such method which has been employed widely is the application of so-called plater's tape such as that which is available from 3M Corporation. This method is mostly employed for plating of cylindrical or approximately cylindrical parts where the tape can be wrapped around and doubled over itself a number of times.

Another masking method commonly used employs a polymeric material such as paint, lacquer or the like which is applied to the areas to be masked by any appropriate means such as brush, stencil, screen printing and the like. Rubber and other elastomeric materials have also been employed particularly where the areas to be masked are the outside diameters of disc-like configurations or the inside diameters of annular shapes. Easy application and removal are the advantages of these types of material.

However, none of the above masking techniques is completely suited for use in the electroless application of nickel. Thus, engineering type electroless nickel plating processes are operated at very high temperatures, typically from about 180° to 200° F., and for prolonged periods up to about 24 hours or longer. Under such conditions plater's type tape, paint, lacquer and the like will soften and lose adhesion resulting in deposition of nickel on areas where it is not wanted. Removable masks such as rubber and other elastomeric materials have the disadvantage of allowing seepage of plating solution under the mask edges thus giving rise to irregular edge configurations. This seepage problem is aggravated by high temperatures, long deposition times and surfactant-containing plating solutions.

None of the above methods lends itself to the selective plating of electroless nickel or copper on small or complex patterns where the mask itself has to be applied in a finely detailed pattern and seepage under, or partial failure of, the mask cannot be tolerated.

It has now been found that if chromium is employed as a mask for the electroless deposition of nickel or copper, the problems noted above are circumvented. The use of chromium and other metals such as aluminum and nickel as a mask or resist in plating substrates with various metals has been described previously. Illustratively, Reilly U.S. Pat. No. 2,028,013 describes ornamenting an article by electroplating with chromium, cutting through the chromium layer to form an ornamental pattern and electroplating gold on the exposed substrate. Barnhart U.S. Pat. No. 1,996,187 shows a process of masking metal plated articles in which a layer of chromium is deposited on a base such as nickel, a pattern is etched in the chromium, and a metal of dissimilar color to the chromium (e.g. gold, copper, silver, nickel) is electroplated on to the exposed metal of the base.

Brown et al. U.S. Pat. No. 3,809,625 describe a process for using chromium as a mask in making compact bumps on a semi-conductor wafer. The process comprises forming a metallization pattern on the wafer, providing a continuous film of glass over the pattern with holes in the film over contact pads, depositing a layer of chromium over the glass, forming contact pads of metal e.g. gold on the chromium layer over the holes in the glass, depositing bump metal e.g. silver on to the pads, then removing the exposed portions of the chromium layer.

Russell U.S. Pat. No. 2,367,314 shows the use of nickel as a masking material for selectively electroplating gold on a conductive substrate.

Russell U.S. Pat. No. 3,948,736 teaches the selective electroplating (as opposed to electroless plating) of precious metals on a substrate using metals such as aluminum as the masking material.

The use of electroplated chromium as a mask for the electroless deposition of nickel or copper on selected areas of a conductive substrate has not been described or suggested heretofore and the advantages which flow therefrom have gone unrecognized.

SUMMARY OF THE INVENTION

The invention comprises an improved method of electrolessly depositing nickel or copper on selected areas of a conductive substrate wherein the improvement comprises employing chromium to mask the areas of said substrate on to which deposition of nickel or copper is unwanted. Optionally, the chromium mask can be removed, for example by short immersion in aqueous hydrochloric or conventional electrolytic alkaline strippers, after deposition of the nickel or copper is complete.

The use of chromium as the masking material is free from the disadvantages hitherto encountered with other masking materials as discussed above. Thus the layer of chromium, which can be as thin as 0.007 mil, is leak proof against deposition of nickel or copper and will withstand prolonged immersion in the nickel plating bath at elevated operating temperatures. Further the chromium layer adheres to large flat surfaces and small, intricate areas with an equal degree of tenacity and can be applied by techniques which are well-recognized in the art. It is equally effective as a mask when used over a variety of metallic substrates including steel, copper, copper alloys and aluminum. It can also be used as a mask on non-conductive substrates when applied by sputtering techniques as described hereinafter.

The process of the invention has a wide variety of applications. Illustratively it can be employed as a step or steps in the fabrication of micro-circuitry, semiconductors, diodes, transistors, lead frames and the like. It can also be employed to prevent extraneous deposition of nickel or copper on metallic process components such as tank walls, heaters, stirrers, pumps, racks, fixtures, control sensors and the like which normally come into contact with electroless nickel or copper plating solutions.

DETAILED DESCRIPTION OF THE INVENTION

In the process of the invention the electroless deposition of nickel or copper on the conductive substrate is carried out in accordance with prior art procedures. the novel step of the process comprises the masking of those areas on which nickel or copper is not to be deposited by applying to said areas a layer of chromium, advantageously by electroplating or in certain cases by sputtering as discussed below, prior to electroless deposition of nickel or copper. In order to accomplish this step of the process those areas which are eventually to receive nickel or copper have to be masked. Since the operating temperature of the bath employed in electroplating chromium is relatively low (circa 100° F.) and residence time therein of the part being plated is very short (2-3 minutes) it is possible to employ plater's tape, polymeric materials, rubber and other elastomeric materials as masking elements without encountering the problems discussed above in regard to the use of such materials as masking elements under the much more severe conditions encountered in the electroless deposition of nickel. However, in the case of very small, intricate masking patterns required in fabrication of microcircuits and the like, it is preferable to employ a plating resist. Such resists, including inks, can be applied in the required pattern by stencil, screen printing or other known methods. Generally, the resist will be a photosensitive type (negative or positiveacting) and can be of the dry film or liquid type. Where a photoresist is employed to produce the required pattern of plating resist on the substrate, the pattern is generated in the manner conventional in the art, namely, by coating the substrate with a layer of photoresist, exposing the latter to actinic radiation via a positive or negative image depending on the nature of the photoresist and developing the resulting photoresist image.

The electroplating of the exposed areas of the masked substrate with chromium is carried out in accordance with procedures well-known and routinely employed in the art. Thus, the exposed areas of the substrate are cleaned and prepared in accordance with conventional procedures. Typically the cleaning and preparation comprises soak cleaning and electrocleaning in appropriate solutions, pickling in dilute mineral acid such as 10% w/w sulfuric acid and, finally, rinsing with water. The chromium electroplating bath and mode of operation can be any of those routinely employed; see, for example, Encyclopedia of Chemical Technology, Third Edition, Vol. 6 pages 103-4, Editor Kirk-Othmer, John Wiley and Sons, New York.

Illustratively the electroplating bath is maintained at a temperature of about 90° F. to about 150° F. and preferably at a temperature of about 110° F. to about 115° F. Plating is continued at least until the thickness of the layer of chromium has reached about 0.01 mils and preferably has reached a thickness of about 0.02 mils to about 0.1 mils. The upper limit of thickness is not critical and is dictated by economic considerations. The plating of thicknesses in excess of the above amounts in not only wasteful in terms of the amount of chromium used but also requires additional time and reagent use of the chromium mask is to be removed at a later stage in the process of the invention.

In certain cases, such as the coating of nonconductive substrates or the masking of small parts it is preferable or necessary to apply the chromium masking layer by conventional sputtering techniques rather than by electroplating. Sputtering techniques are described, for example, in Encyclopedia of Chemical Technology, Third Edition, Vol. 15, pp 265 et seq., Editor Kirk-Othmer.

When the application of the masking layer of chromium has been applied, the plater's tape, rubber or elastomeric mask or polymeric plating resist employed as the material masking the areas to be nickel plated is removed in the appropriate manner. Manual removal is employed in the case of tape, rubber and the like and stripping solvents and the like are used in the case of polymeric resists.

The area of substrate which is exposed by removal of the plating mask is then cleaned and prepared using methods such as those described above for the preparation of the surface for chromium plating. Electroless plating of these areas with nickel or copper is then carried out using plating baths and procedures conventionally employed in the art. Illustrative of such procedures in the case of electroless nickel plating are those set forth in U.S. Pat. Nos. 2,532,283; 2,658,839; 2,658,841 and 2,658,842 and in a review by Brenner entitled "Electroless Plating Comes of Age", Metal Finishing December 1954 pp 61-76. Essentially the bath or solution employed in electroless nickel deposition includes a soluble source of nickel ions, a reducing agent such as a hypophosphite compound, a complexing agent to prevent precipitation of metal ions from solution and an acid or alkaline pH adjusting compound and, optionally, buffering agents. Brightening agents such as small amounts of lead, bismuth, antimony, molybdenum and like metals can be employed in the plating bath, if desired. A particularly preferred brightening agent is a soluble acetylenic compound such as butynediol, propargyl alcohol, ethoxylated propargyl alcohol, propoxylated propargyl alcohol, ethoxylated butynediol, ethoxylated methylbutynediol and the like. Plating baths containing the latter type brightening agents are described in U.S. Pat. No. 4,600,609.

The plating bath is typically maintained at a temperature in the range of about 170° F. to about 200° F. and preferably in the range of about 180° F. to about 195° F. The chromium masked substrate is maintained in the bath until the desired thickness of nickel has been deposited. Typically a thickness of at least about 1.0 mil is applied but the particular thickness of the nickel layer applied in any given instance is a matter of choice depending upon the end use for which the nickel plated substrate is to be employed.

Any of the methods and compositions conventionally employed in the electroless deposition of copper can be employed when the chromium masked substrate is to be plated with copper. Illustrative of such methods and compositions are those described by Raymond H. Clark, Handbook of Printed Circuit Manufacturing, pp 300-324, Van Nostrand Reinhold Company, New York, 1985.

The substrates employed in accordance with the process of the invention are metallic substrates such as aluminum, steel, copper, brass, as well as glass, ceramics, resins and the like which optionally have been provided with a conductive surface such as by electroless deposition of a copper layer followed by electrolytic deposition of additional copper or other metal. In the case of most such conductive substrates the electroless deposition of nickel thereon is autocatalytic. However, as is well recognized in the art, in the case of brass or other copper alloys it is necessary to employ an electrolytic or galvanic or chemical or other means of initiation of the plating after which electroless deposition of nickel commences.

When the electroless deposition of nickel or copper is completed the chromium mask may be removed, if so desired, or may be left intact if its presence will not interfere with subsequent operations. Typical of the latter is the electroless deposition of copper on the nickel layer. Removal of the chromium mask may be accomplished readily be dissolution of the chromium in mineral acid such as hydrochloric acid.

The following examples illustrate the process of the invention and the best mode known to the inventors of carrying out the same but are not to be construed as limiting.

EXAMPLE 1

The bearing journals of a steel drive shaft were masked using plater's tape. The exposed surfaces of the shaft were then processed through a preplate cycle comprising soak-cleaning and electro-cleaning in a commercial metal cleaning solution [Metax T-103; MacDermid Inc., Waterbury, CT.], rinsing with water, pickling in 10% w/w sulfuric acid and finally rinsing with water. The clean exposed surface of the shaft was then subjected to electroplating with chromium using a commercial chromium plating bath [Macrome TM 8210; MacDermid Inc.] at a current density of 130 amperes/square foot for 1 minute. The bath temperature was 115° F. The thickness of the chromium layer so deposited was about 0.02 mil. The chromium plated shaft so obtained was rinsed with water and the plater's tape was removed from the bearing journals. The exposed bearing journal surfaces were then cleaned using the same preplate cycle except for the omission of an electrocleaner, as for the shaft surfaces before being plated by immersion in a commercial electroless nickel plating bath [MacDermid Electroless Nickel 8030-S; MacDermid Inc.] maintained at 190° F. After 2 hours immersion the thickness of the nickel layer deposited on the journal bearings was 1 mil. No trace of nickel was found on the chromium plated surface of the shaft. The shaft was then immersed briefly (5 minutes) in 50% w/v solution of hydrochloric acid at room temperature (circa 70° F.) to remove the chromium layer without affecting the nickel layer. The shaft was then rinsed with water and dried. The edges of the nickel-plated area were found to be clean and sharp.

EXAMPLE 2

A pattern was market out on a flat brass panel using plater's tape. The exposed areas of the panel were subjected to a preplate cycle followed by chromium plating using the procedure and materials described in Example 1. The tape was then removed and the exposed surfaces were subjected to the preplate and electroless nickel deposition steps described in Example 1 except for the additional step of activating the panel by application of current from a 1.5 volt battery for 10 seconds prior to immersion of the panel in the electroless nickel plating bath. The activation step was necessary since brass is not autocatalytic to the electroless nickel deposition. The brass panel was immersed in the plating bath for 20 minutes at 190° F. No nickel plating occurred on the chromium layer during this step. At the end of this period the panel was rinsed with water and then immersed briefly in a 50 percent w/v solution of hydrochloric acid to remove the chromium masking layer followed by rinsing with water and drying. The edges of the pattern were found to be clean and sharply defined.

EXAMPLE 3

A pattern was marked out on an aluminum panel using plater's tape. The panel was then subjected to a preplate cycle which comprised of a soak cleaning step [immersion in a bath of TS40A, a commercial soak cleaner available from MacDermid Inc.], cold water rinse, immersion in a commercial deoxidizing bath [Metex$^R$ 7105 to which was added 0.5 lb. per gallon of Metex$^R$ Etch Salts: MacDermid Inc.], cold water rinse, immersion in a bath of a commercial zincate [Metex 8611 Zincate; MacDermid Inc.] and a final cold water rinse. The panel so prepared was then subjected to electroplating with chromium for 2 minutes using the same procedure and plating bath described in Example 1. The chromium plated panel was rinsed with cold water and the tape mask was pulled off. The surfaces of the aluminum panel so exposed were then subjected to the same preplate cycle as that described above for the areas which were chromium plated. Thereafter, the panel was placed in an electroless nickel plating bath (same as employed in Example 1) and maintained therein for 20 minutes at 185° F. The thickness of the nickel layer was found to be 0.2 mil. The resulting panel was rinsed with water and dried. There was no evidence of deposition of nickel on the chromium layer. The boundary between the nickel and chromium layers was sharp and clearly defined.

EXAMPLE 4

A pattern was marked out on a steel panel using plater's tape. The exposed surfaces of the panel were subjected to a preplate cycle comprising immersion in a commercial soak cleaner [Metex S-1707: MacDermid Inc.], rinsing with cold water, immersion in a commercial electrocleaner bath [Metex E-1726], rinsing with cold water, brief immersion in aqueous (50%) hydrochloric acid and finally rinsing with cold water. The resulting panel was subjected to electroplating with chromium for 2 minutes using the same procedure and plating bath described in Example 1. The chromium plated panel was rinsed with cold water and the tape mask was peeled off. The surface of the steel panel so exposed was then subjected to a preplate cycle comprising immersion in soak cleaner [Metex S-1707] rinsing with cold water, immersion in a commercial acid bath [Metex M-629 with direct current]followed by rinsing with cold water. The resulting chromium masked steel plate was placed in an electroless copper plating bath [Macuplex$^R$ 7960: MacDermid Inc.] for a period of 30 minutes at a temperature of 110° F. The thickness of copper deposited was about 0.1 mil. After removal from the plating bath the panel was rinsed with cold water and dried. The chromium layer on the finished panel was entirely free from deposition of copper and the boundary between chromium pattern and copper was very sharp.

EXAMPLE 5

A container for a transistor core was hermetically sealed by soldering the steel cap to the aluminum body after subjecting the contact areas of the cap and base to plating with nickel in accordance with the process of the invention. The procedure employed was as follows.

A layer of a positive photoresist (ULTRMAC ™ PR-914:MacDermid, Inc.) is applied to the top of the aluminum body and exposed via an appropriate image to actinic radiation. The image is developed using an alkaline developer leaving exposed all but the contact area with which the seal to the cap is to be formed. The container is then baked at about 215° F. for a time sufficient to harden the resist after which a layer of chromium is applied to all the exposed aluminum surfaces by sputtering using conventional techniques. The resist image is then solvent stripped and the container is dried and immersed in a commercial electroless nickel plating bath [MacDermid Electroless Nickel 8030-S] maintained at 190° F. for a period of about 15 minutes. After removal from the plating bath the container body is rinsed with water and dried. The cap is then sealed on the body by application of solder between the abutting surfaces of the cap and the nickel-plated contact area on the body.

The above procedure can be repeated using a negative resist in place of a positive photoresist in the initial masking step to produce the desired resist layer on the contact area.

In a modification of the above-described process the chromium layer is removed from the body, prior to the final soldering step, by immersing the body briefly (about 5 minutes) in 50% w/v solution of hydrochloric acid at room temperature (circa 70° F.). After removal from the acid the part is rinsed with cold water and dried before carrying out the sealing step.

EXAMPLE 6

The procedure described in Example 5 is employed in the process of applying nickel selectively to predetermined areas of silicon wafers employed in the fabrication of semiconductor devices. The areas to which nickel is to be applied by electroless plating are first protected by applying and developing a photoresist image using the technique described in Example 5. The exposed areas of the wafer not protected by the resist image are then plated with chromium by sputtering. The resist image is solvent stripped and the areas so exposed are electrolessly plated with nickel using the procedure described in Example 5. The chromium mask is then removed by immersing the wafer in a 50% w/v solution of hydrochloric acid using the procedure described in Example 5.

What is claimed is:

1. In a process for the electroless deposition of nickel or copper on preselected areas of a substrate wherein the areas other than those which are to receive nickel or copper plating are protected by a mask, the improvement which comprises employing as said mask a layer of chromium.

2. A process according to claim 1 wherein said mask of chromium is applied by electroplating.

3. A process according to claim 1 wherein said mask os chromium is applied by sputtering.

4. A process according to claim 1 wherein said mask of chromium is removed after the electroless deposition of nickel or copper is complete.

5. A process according to claim 4 wherein said mask is removed using a mineral acid which does not attack the layer of electrolessly deposited nickel or copper.

6. A process according to claim 5 wherein said mineral acid is hydrochloric acid.

7. A process for the electroless deposition of nickel or copper on preselected areas of a conductive substrate wherein the areas on which nickel or copper is to be deposited are covered by a first mask material, the exposed surfaces of said substrate are covered by a second mask comprising a layer of chromium, said first mask material is removed and the surfaces so exposed are plated with nickel or copper by electroless deposition.

8. A process according to claim 7 wherein said first mask material is plater's tape.

9. A process according to claim 7 wherein said first mask material is applied by coating said substrate with a photoresist material, exposing said photoresist to actinic radiation via an image, and developing said image so as to leave exposed photoresist on the areas to be protected from subsequent deposition of chromium.

10. A process according to claim 7 wherein said second mask is removed after electroless deposition of nickel is complete.

11. A process according to claim 10 wherein said second mask is removed using a mineral acid which does not attack the layer of electrolessly deposited nickel.

12. A process according to claim 11 wherein said mineral acid is hydrochloric acid.

13. A process according to claim 7 wherein said layer of chromium is applied by electroplating.

14. A process according to claim 7 wherein said layer of chromium is applied by sputtering.

* * * * *